United States Patent
Kuki et al.

(10) Patent No.: US 12,274,059 B2
(45) Date of Patent: Apr. 8, 2025

(54) SEMICONDUCTOR STORAGE DEVICE AND METHOD OF MANUFACTURING SEMICONDUCTOR STORAGE DEVICE

(71) Applicant: Kioxia Corporation, Tokyo (JP)

(72) Inventors: Tomohiro Kuki, Yokkaichi (JP); Tatsufumi Hamada, Nagoya (JP); Shinichi Sotome, Yokkaichi (JP); Yosuke Mitsuno, Yokkaichi (JP); Muneyuki Tsuda, Ichinomiya (JP)

(73) Assignee: Kioxia Corporation, Tokyo (JP)

( * ) Notice: Subject to any disclaimer, the term of this patent is extended or adjusted under 35 U.S.C. 154(b) by 739 days.

(21) Appl. No.: 17/204,015

(22) Filed: Mar. 17, 2021

(65) Prior Publication Data
US 2022/0068964 A1 Mar. 3, 2022

(30) Foreign Application Priority Data

Aug. 28, 2020 (JP) ................................ 2020-144747

(51) Int. Cl.
*H10B 51/20* (2023.01)
*H01L 21/306* (2006.01)
*H01L 21/311* (2006.01)
*H10B 41/27* (2023.01)
*H10B 43/27* (2023.01)

(52) U.S. Cl.
CPC ....... *H10B 43/27* (2023.02); *H01L 21/30604* (2013.01); *H01L 21/31111* (2013.01); *H10B 41/27* (2023.02); *H10B 51/20* (2023.02)

(58) Field of Classification Search
CPC ........ H10B 43/27; H10B 41/27; H10B 43/10; H10B 41/10
See application file for complete search history.

(56) References Cited

U.S. PATENT DOCUMENTS

| 11,476,273 | B2* | 10/2022 | Lue ........................ H10B 43/10 |
| 2015/0340371 | A1* | 11/2015 | Lue ........................ H10B 43/27 |
| | | | 257/324 |
| 2016/0141299 | A1 | 5/2016 | Hong |
| 2017/0148805 | A1 | 5/2017 | Nishikawa et al. |
| 2017/0263623 | A1* | 9/2017 | Zhang .................... H10B 43/27 |
| 2019/0371803 | A9* | 12/2019 | Kanakamedala ........................... H01L 29/42328 |
| 2020/0098785 | A1* | 3/2020 | Kariya ................... H10B 43/10 |
| 2020/0185403 | A1 | 6/2020 | Nyui et al. |
| 2022/0189981 | A1* | 6/2022 | Sakotsubo ............. H10B 41/48 |

FOREIGN PATENT DOCUMENTS

JP 2020-92168 A 6/2020

* cited by examiner

*Primary Examiner* — Suberr L Chi
*Assistant Examiner* — Carnell Hunter, III
(74) *Attorney, Agent, or Firm* — Oblon, McClelland, Maier & Neustadt, L.L.P.

(57) ABSTRACT

According to one embodiment, a semiconductor storage device includes a substrate, a first electric charge holder, and a channel layer. At least a part of the first electric charge holder is curved in a first cross section along a surface of the substrate. The channel layer is inside the first electric charge holder in the first cross section. At least a part of the channel layer is curved in the first cross section. The first electric charge holder has a curvature varying in accordance with a position in the first cross section. The channel layer has a film thickness varying in accordance with the curvature of the first electric charge holder in the first cross section.

20 Claims, 9 Drawing Sheets

SEMICONDUCTOR STORAGE DEVICE AND METHOD OF MANUFACTURING SEMICONDUCTOR STORAGE DEVICE

CROSS-REFERENCE TO RELATED APPLICATION

This application is based upon and claims the benefit of priority from Japanese Patent Application No. 2020-144747, filed Aug. 28, 2020; the entire contents of which are incorporated herein by reference.

FIELD

Embodiments described herein relate generally to a semiconductor storage device and a method of manufacturing a semiconductor storage device.

BACKGROUND

Semiconductor storage devices including a laminate in which insulating layers and word lines are alternately laminated and a plurality of memory pillars which pass through the laminate in a thickness direction of the laminate are known. It is expected that electrical characteristics of semiconductor storage devices will be improved.

DETAILED DESCRIPTION

Figure 1:
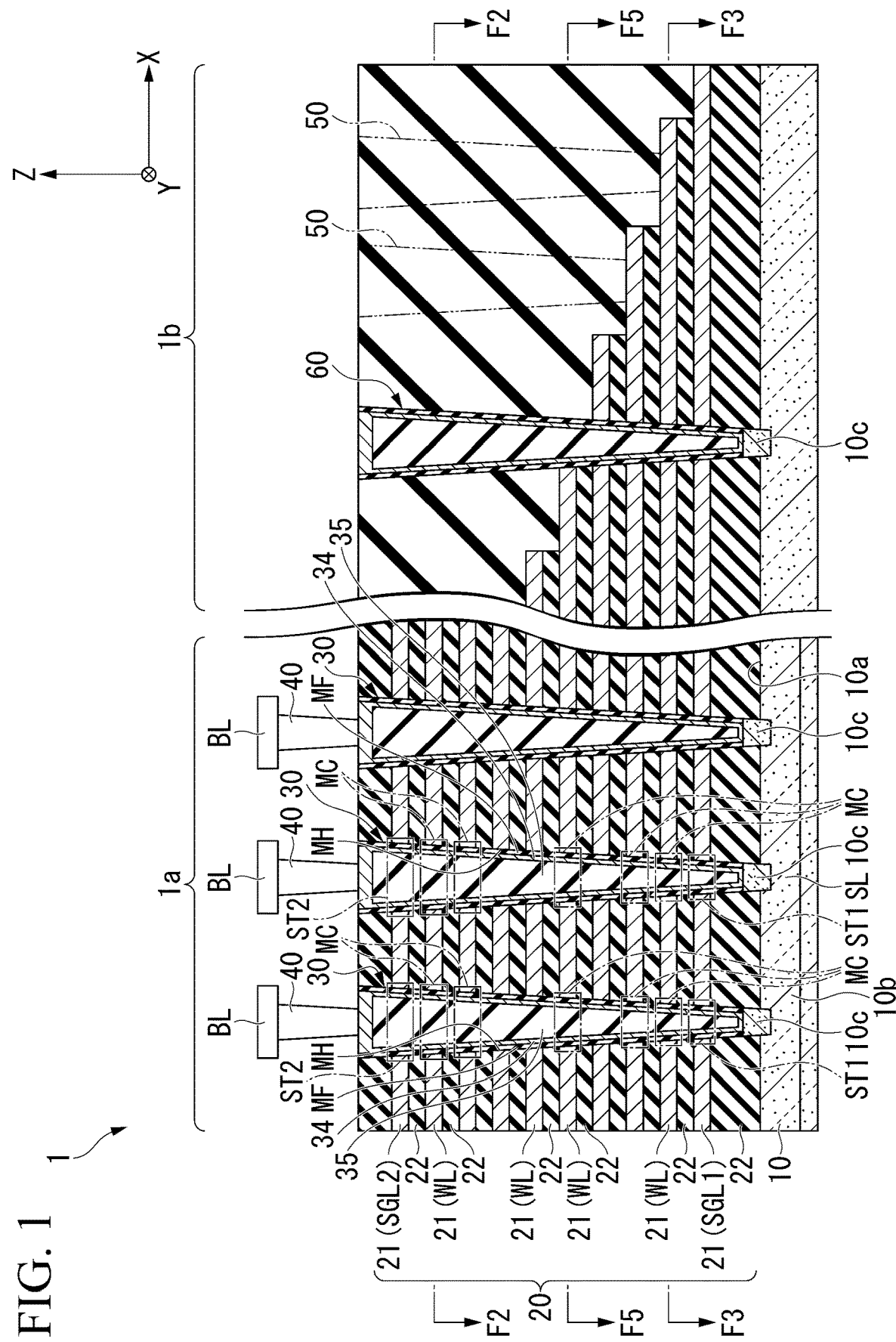
FIG. 1 is a cross-sectional view showing a semiconductor storage device of an embodiment.

According to one embodiment, a semiconductor storage device includes a substrate, a first electric charge holder, and a channel layer. At least a part of the first electric charge holder is curved in a first cross section along a surface of the substrate. The channel layer is inside the first electric charge holder in the first cross section. At least a part of the channel layer is curved in the first cross section. The first electric charge holder has a curvature varying in accordance with a position in the first cross section. The channel layer has a film thickness varying in accordance with the curvature of the first electric charge holder in the first cross section.

Hereinafter, a semiconductor storage device and a method of manufacturing a semiconductor storage device of an embodiment will be described with reference to the drawings. In the following description, the same reference signs are applied to configurations having the same or similar functions. Further, duplicate description of these components may be omitted. In this specification, the term "parallel" includes a case of "substantially parallel". In this specification, the term "orthogonal" includes a case of "substantially orthogonal". In this specification, the term "connect" includes not only a case in which two members are adjacent to each other without anything therebetween but also a case in which two members are adjacent to each other with another member interposed between the two members. In this specification, the term "a ring shape" is not limited to a circular ring shape and includes a rectangular or triangular ring shape. In this specification, the expression "XX is provided on YY" is not limited to a case in which XX is in contact with YY and includes a case in which another member is interposed between XX and YY.

First, an X direction, a Y direction, and a Z direction will be defined. The X direction and the Y direction are directions along a surface 10a of the silicon substrate 10 (refer to FIG. 1, which will be described below). The X direction is a direction in which word lines WL (refer to FIG. 1, which will be described below) extend. The Y direction is a direction intersecting (for example, orthogonal to) the X direction. The Y direction is a direction in which bit lines BL (refer to FIG. 1, which will be described below) extend. The Z direction is a direction intersecting (for example, orthogonal to) the X direction and the Y direction. The Z direction is a thickness direction of the silicon substrate 10 (refer to FIG. 1). In this specification, a direction toward a laminate 20 (which will be described below) from the silicon substrate 10 in the Z direction may be referred to as "upward", and a direction opposite thereto may be referred to as "downward". However, these expressions are given for the sake of convenience and do not restrict a direction of gravity.

a semiconductor storage device includes a laminate in which insulating layers and word lines are alternately laminated, and a plurality of memory pillars which pass through the laminate in a thickness direction of the laminate. In this semiconductor storage device, intersections between the word lines and the memory pillars function as memory cells. In such a semiconductor storage device, in a case where the number of laminated layers of the laminate increases, cross-sectional shapes of the memory cells may be distorted into non-complete circular shapes due to one or more reasons of manufacturing or the like. In this case, electrical characteristics (for example, write characteristics) of the semiconductor storage device may deteriorate.

Hence, in the semiconductor storage device of the embodiment, a particular part of a channel layer included in the memory pillars is formed to be thick. Accordingly, electrical characteristics of the semiconductor storage device may be improved. Hereinafter, such a semiconductor storage device will be described. However, the present invention is not limited by the embodiment described below.

Embodiment

1. Configuration of Semiconductor Storage Device

First, a configuration of a semiconductor storage device 1 of the embodiment will be described. The semiconductor storage device 1 is a nonvolatile semiconductor storage device, and is, for example, a NAND flash memory.

<1.1 Overall Configuration of Semiconductor Storage Device>

FIG. 1 is a cross-sectional view showing the semiconductor storage device 1. For example, the semiconductor storage device 1 includes the silicon substrate 10, the laminate 20, a plurality of memory pillars 30, a plurality of contacts 40, a plurality of contacts 50, a plurality of bit lines BL, and a plurality of support pillars 60 (only one is shown in FIG. 1). From another viewpoint, the semiconductor storage device 1 includes a memory region 1a in which memory cells MC (which will be described below) are provided, and a contact region 1b in which a plurality of conductive layers 21 (which will be described below) are disposed in a stepped shape.

The silicon substrate 10 is a substrate as a base for the semiconductor storage device 1. At least a portion of the silicon substrate 10 has a plate shape along the X direction and the Y direction. The silicon substrate 10 has the surface 10a facing the laminate 20. The silicon substrate 10 is formed of a semiconductor material including silicon (Si). For example, the silicon substrate 10 includes a source region 10b in which an impurity is diffused and which functions as a part of a source line SL. However, the source line SL may be provided on insulating layers laminated on the silicon substrate 10 instead of being provided on the silicon substrate 10. The silicon substrate 10 is an example of "a substrate".

The laminate 20 is provided on the silicon substrate 10. For example, the laminate 20 includes the plurality of conductive layers 21 and a plurality of insulating layers 22. The plurality of conductive layers 21 and the plurality of insulating layers 22 are alternately laminated one by one in the Z direction. In FIG. 1, only ten conductive layers 21 are shown as an example, but actually more conductive layers 21 and more insulating layers 22 are laminated.

The conductive layers 21 have a plate shape in the X direction and the Y direction. The conductive layers 21 extend in the X direction. The conductive layers 21 are formed of a conductive material such as tungsten (W). In the plurality of conductive layers 21, one (or two) conductive layer 21 closest to the silicon substrate 10 functions as a first selection gate line SGL1. Intersections between the first selection gate line SGL1 and the memory pillars 30 function as first selection transistors ST1. A predetermined voltage is applied to the first selection gate lines SGL1 when the first selection transistors ST1 are in an ON state and the memory pillars 30 and the source line SL are electrically connected to each other. The first selection gate line SGL1 is provided in common with respect to the plurality of memory pillars 30.

On the other hand, in the plurality of conductive layers 21, one (or two) conductive layer 21 farthest from the silicon substrate 10 functions as a second selection gate line SGL2. Intersections between the second selection gate line SGL2 and the memory pillars 30 function as second selection transistors ST2. A predetermined voltage is applied to the second selection gate line SGL2 when the second selection transistors ST2 are in an ON state and the memory pillars 30 and the bit lines BL are electrically connected to each other. The second selection gate line SGL2 is provided in common with respect to the plurality of memory pillars 30.

In the plurality of conductive layers 21, the remaining conductive layers 21 sandwiched between the conductive layers 21 functioning as the first selection gate line SGL1 or the second selection gate line SGL2 function as the word lines WL. Intersections between the word lines WL and the memory pillars 30 function as the memory cells (memory cell transistors) MC. Accordingly, a plurality of memory cells MC are disposed in a matrix shape with gaps therebetween in the X direction, the Y direction, and the Z direction. The memory cells MC will be specifically described below. A voltage is applied to the word lines WL when data is written in the memory cells MC, when data is read from the memory cells MC, and when data is deleted from the memory cells MC. Each of the word lines WL is provided in common with respect to the plurality of memory cells MC positioned at the same height in the Z direction.

The conductive layers 21 is provided throughout the memory region 1a and the contact region 1b. The length of the conductive layer 21 positioned in the contact region 1b becomes shorter as the conductive layer 21 becomes farther from the silicon substrate 10. Accordingly, the plurality of conductive layers 21 are disposed in a stepped shape. The contacts 50 are respectively connected to the plurality of conductive layers 21 in the contact region 1b. Accordingly, a voltage is independently applied to each of the plurality of conductive layers 21.

The insulating layers 22 have a plate shape along the X direction and the Y direction. The insulating layers 22 are formed of an insulating material such as silicon oxide ($SiO_2$).

The plurality of memory pillars 30 are provided in the memory region 1a. The plurality of memory pillars 30 extend in the Z direction and pass through the laminate 20 in the Z direction. The plurality of memory pillars 30 are disposed in a matrix shape in the X direction and the Y direction. Each of the memory pillars 30 includes a multilayer film MF, a channel layer 34, and a core insulator 35. In the embodiment, a lower end of each of the memory pillars 30 is connected to the source region 10b of the silicon substrate 10 via a connector 10c provided on the silicon substrate 10. For example, the connector 10e is formed of a single crystal substance such as amorphous silicon (a-Si). A configuration of the memory pillar 30 will be specifically described in description related to a configuration of the memory cell MC.

The plurality of contacts 40 are provided on the plurality of memory pillars 30. The plurality of contacts 40 are connected to the plurality of memory pillars 30 in a one-on-one relationship.

The plurality of bit lines BL are provided on the plurality of contacts 40. Each of the bit lines BL is connected to the corresponding memory pillar 30 with the contact 40 therebetween. Accordingly, due to combinations of the word lines WL and the bit lines BL, an arbitrary memory cell MC is selected from the plurality of memory cells MC disposed in a three-dimensional shape.

The plurality of support pillars 60 are provided in the contact region 1b. The support pillars 60 extend in the Z direction, pass through one or more conductive layers 21 in the Z direction, and are connected to the silicon substrate 10 via the connectors 10c. The plurality of support pillars 60 are structures for supporting the plurality of conductive layers 21 in the contact region 1b during a replacement step (which will be described below) that is one of steps of manufacturing the semiconductor storage device 1. In the embodiment, the support pillars 60 are formed through the same process as the memory pillars 30 and have the same structure as the memory pillars 30. That is, film thicknesses of the channel layers 34 are partially increased as will be described below.

<1.2 Configuration of Memory Cell>

Next, a configuration of the memory cell MC will be described.

Figure 2:
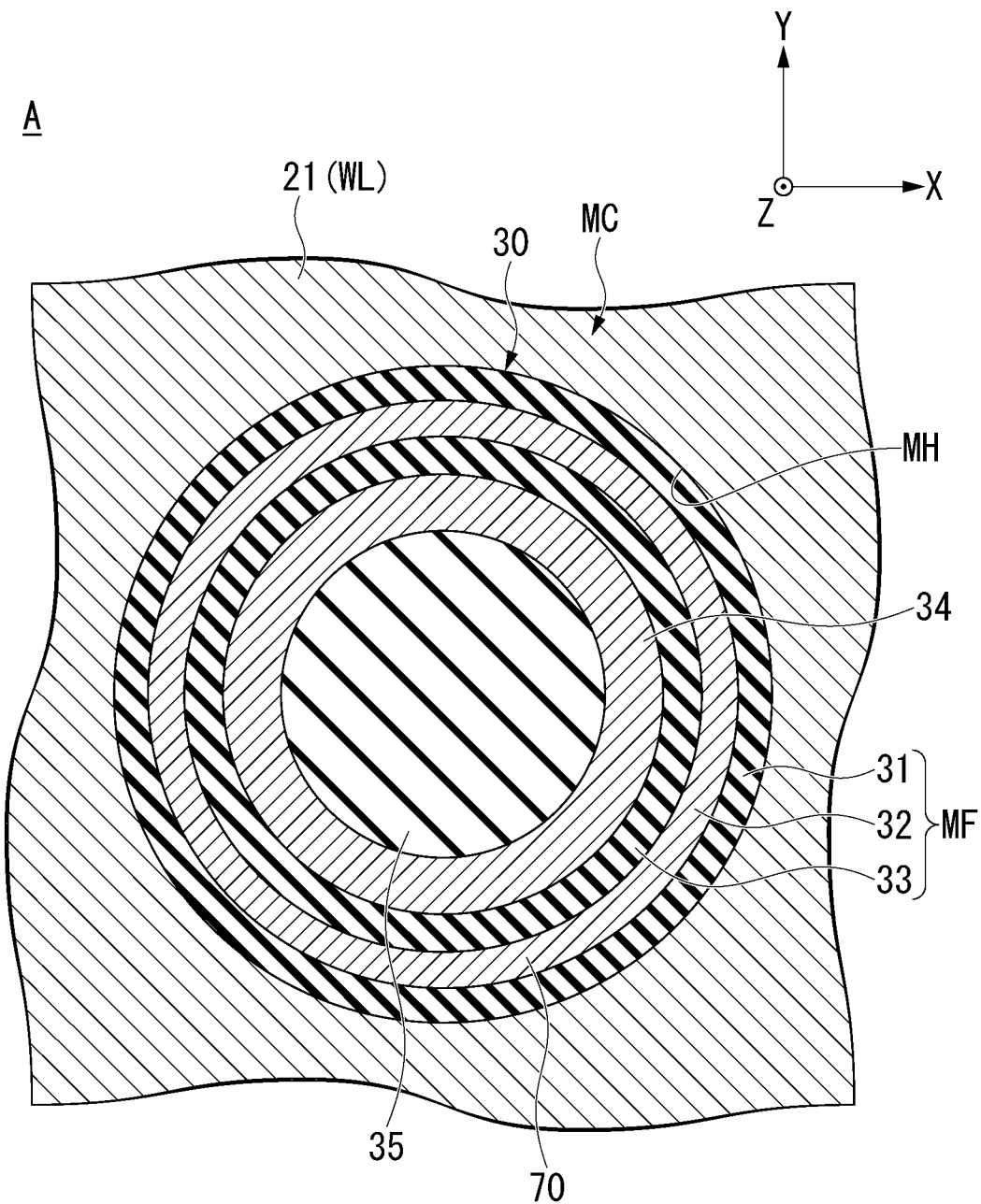
FIG. 2 is a cross-sectional view of the semiconductor storage device along line F2-F2 shown in FIG. 1.

FIG. 2 is a cross-sectional view of the semiconductor storage device 1 along line F2-F2 shown in FIG. 1. The memory pillars 30 are formed by forming a plurality of functioning layers inside memory holes MH passing through the laminate 20 in the Z direction. In the embodiment, for example, the memory pillar 30 includes the multi-layer film MF, the channel layer 34, and the core insulator 35. The multi-layer film MF includes a block insulating film 31, a memory film 32, and a tunnel insulating film 33.

The block insulating film 31 is provided on an inner circumferential surface of the memory holes MH. For example, the block insulating film 31 has a ring shape along the inner circumferential surface of the memory holes MH. The block insulating film 31 is surrounded by the word line WL and is in contact with the word line WL. The block insulating film 31 is provided between the word line WL and the memory film 32. The block insulating film 31 is an insulating film for curbing back-tunneling. Back-tunneling is a phenomenon in which electric charges return to the memory film 32 through the word line WL. The block insulating film 31 extends in the Z direction throughout a great part of the memory pillar 30 in the Z direction. For example, the block insulating film 31 is a laminated structure layer in which a plurality of insulating films such as silicon oxide films or metal oxide films are laminated. Aluminum oxide ($Al_2O_3$) is an example of metal oxide. The block insulating film 31 may include a material having a high dielectric constant (high-k material), such as silicon nitride (SiN) or hafnium oxide (HfO).

The memory film 32 is provided on an inner side of the block insulating film 31. In the embodiment, the expression "provided on an inner side" or "being inside" denotes being provided inside a certain curved part in a cross section along the X direction and the Y direction. For example, it denotes being provided on a central side of the memory pillar 30. This definition also similarly applies to other configurations (for example, the tunnel insulating film 33 and the core insulator 35).

In the embodiment, the memory film 32 is provided on an inner circumferential surface of the block insulating film 31. For example, the memory film 32 has a ring shape along the inner circumferential surface of the block insulating film 31. The memory film 32 is provided between the block insulating film 31 and the tunnel insulating film 33. In the embodiment, the memory film 32 extends in the Z direction throughout a great part of the memory pillar 30. The memory film 32 is, for example, a charge trapping film in which electric charges are stored in a crystal defect. For example, the charge trapping film is formed of silicon nitride ($Si_3N_4$). The memory film 32 may also be referred to as "an electric charge holding film".

In the embodiment, in the memory film 32, a region positioned at the same height as the word line WL in the Z direction functions as an electric charge holder 70. The electric charge holder 70 stores data depending on the amount of holding electric charges. At least a part of the electric charge holder 70 is curved in the cross section along the X direction and the Y direction. In the embodiment, the electric charge holder 70 is formed in a ring shape, and the whole of the electric charge holder 70 is curved in the above-mentioned cross section. However, the electric charge holder 70 may be formed in an arc shape or may have a straight part in a portion thereof.

The tunnel insulating film 33 is provided on an inner side of the memory film 32. In the embodiment, the tunnel insulating film 33 is provided on an inner circumferential surface of the memory film 32. The tunnel insulating film 33 has a ring shape along the inner circumferential surface of the memory film 32. The tunnel insulating film 33 is provided between the memory film 32 and the channel layer 34. In the embodiment, the tunnel insulating film 33 extends in the Z direction throughout a great part of the memory pillar 30. The tunnel insulating film 33 is a potential barrier between the memory film 32 and the channel layer 34. The tunnel insulating film 33 includes silicon oxide ($SiO_2$) or silicon oxide ($SiO_2$) and silicon nitride (SiN).

The channel layer 34 is provided on an inner side of the tunnel insulating film 33. In the embodiment, the channel layer 34 is provided on an inner circumferential surface of the tunnel insulating film 33. For example, the channel layer 34 is formed in a ring shape along the inner circumferential surface of the tunnel insulating film 33. The channel layer 34 is provided between the tunnel insulating film 33 and the core insulator 35. The channel layer 34 extends in the Z direction throughout the overall length (overall height) of the memory pillar 30. A lower end of the channel layer 34 is connected to the source region 10b of the silicon substrate 10 via the connector 10c described above. An upper end of the channel layer 34 is connected to the bit line BL with the contact 40 therebetween. The channel layer 34 is formed of a semiconductor material such as polysilicon (poly-Si). An impurity may be doped into the channel layer 34. An impurity included in the channel layer 34 is any one selected from the group consisting of carbon, phosphorus, boron, and germanium, for example. When a voltage is applied to the word line WL, the channel layer 34 forms a channel and electrically connects the bit line BL and the silicon substrate 10 to each other.

At least a part of the channel layer 34 is curved in the cross section along the X direction and the Y direction. In the embodiment, the channel layer 34 is formed in a ring shape, and the whole of the channel layer 34 is curved in the above-mentioned cross section. However, the channel layer 34 may be formed in an arc shape in accordance with the shape of the electric charge holder 70 or may have a straight part in a portion thereof.

The core insulator 35 is provided on an inner side of the channel layer 34. In the embodiment, the core insulator 35 is formed in a columnar shape (or an inverted truncated cone shape) along an inner circumferential surface of the channel layer 34 and fills an inner circumferential side of the channel layer 34. The core insulator 35 extends in the Z direction throughout a great part of the memory pillar 30. The core insulator 35 is formed of an insulating material such as silicon oxide ($SiO_2$). The core insulator 35 is an example of "an insulator".

In the embodiment, a metal-Al-nitride-oxide-silicon (MANOS) memory cell MC is provided by an end of the word line WL adjacent to the memory pillar 30, the block insulating film 31, the electric charge holder 70, the tunnel insulating film 33, and the channel layer 34.

Here, write operation and read operation of data with respect to the memory cell MC will be described. In write operation of data, a programming pulse is applied to the word line WL adjacent to the memory cell MC that is a write target of data. A programming pulse is a pulse in which a voltage gradually increases every cycle. Accordingly, electrons are absorbed from the channel layer 34 to the electric charge holder 70, and electric charges are stored in the electric charge holder 70. A sense amplifier circuit (not illustrated) included in the semiconductor storage device 1 determines whether or not a threshold voltage of the memory cell MC that is a write target has reached a voltage set in advance in accordance with data of the write target (which will hereinafter be referred to as "wiring data") every cycle of the programming pulse. Further, in accordance with determination results of the sense amplifier circuit, the programming pulse is continuously applied until the threshold voltage of the memory cell MC reaches a voltage corresponding to wiring data.

On the other hand, in read operation of data, electric charges are pre-charged to the bit line BL corresponding to the memory cell MC that is a read target of data. Further, a plurality of kinds of determination potentials (threshold determination voltages) for determining the threshold voltage of the memory cell MC that is the read target are sequentially applied. The sense amplifier circuit determines data stored in the memory cell MC that is the read target by detecting a determination voltage applied to cause electric charges stored in the bit line BL due to pre-charging to flow to the source line SL through the channel layer 34. Hereinafter, in read operation, a current flowing from the bit line BL to the source line SL through the channel layer 34 may be referred to as "a read current".

<1.3 Cross-Sectional Shape of Memory Cell>

As shown in FIG. 2, when viewed in a certain cross section (for example, a cross section along line F2-F2 in FIG. 1, which will hereinafter be referred to as "a cross section A"), the memory cell MC has a complete circular cross-sectional shape. That is, each of the block insulating film 31, the memory film 32, the tunnel insulating film 33, and the channel layer 34 has a complete circular shape or a ring shape close to a complete circle in the cross section A. The core insulator 35 has a complete circular shape in the cross section A. However, the memory pillar 30 is not limited to a pillar including a part formed in a complete circular shape. The memory pillar 30 may have an oval cross-sectional shape throughout the overall length of the memory pillar 30 in the Z direction.

On the other hand, when viewed in another cross section closer to the silicon substrate 10 than the cross section A, a cross-sectional shape of the memory cell MC is distorted into an oval shape due to one or more reasons of manufacturing or the like. Hereinafter, details thereof will be described.

Figure 3:
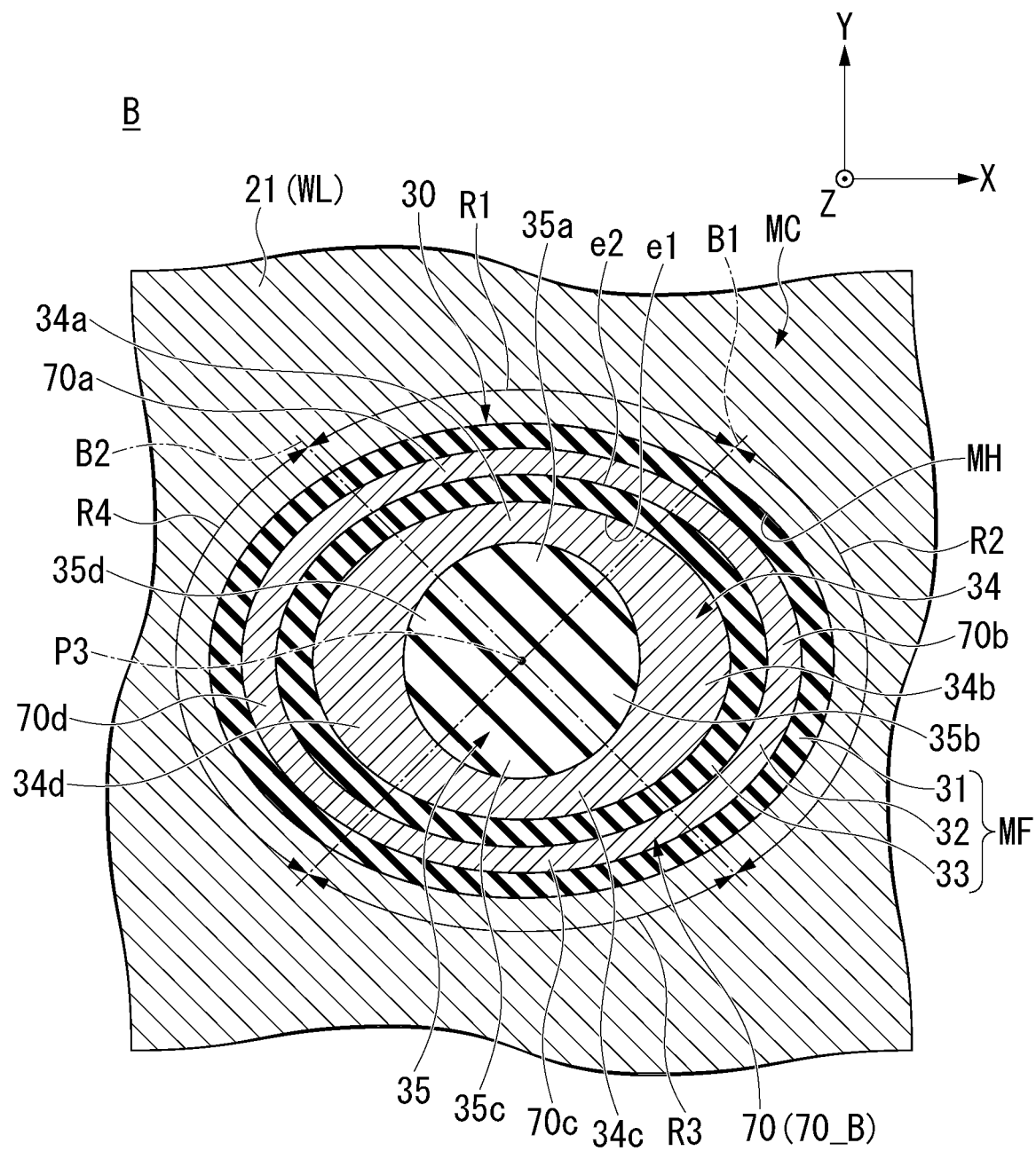
FIG. 3 is a cross-sectional view of the semiconductor storage device along line F3-F3 shown in FIG. 1.

FIG. 3 is a cross-sectional view of the semiconductor storage device 1 along line F3-F3 shown in FIG. 1. Hereinafter, a cross section along line F3-F3 in FIG. 1 will be referred to as "a cross section B". The cross section B is a cross section along the surface 10a of the silicon substrate 10. The cross section B is an example of "a first cross section".

Each of the block insulating film 31, the memory film 32, and the tunnel insulating film 33 has an oval ring shape and includes a curved part in the cross section B. Each of the block insulating film 31, the memory film 32, and the tunnel insulating film 33 includes a part having a small curvature and a part having a large curvature.

Here, "a curvature" referred to in the present embodiment will be described with reference to FIG. 4.

Figure 4:
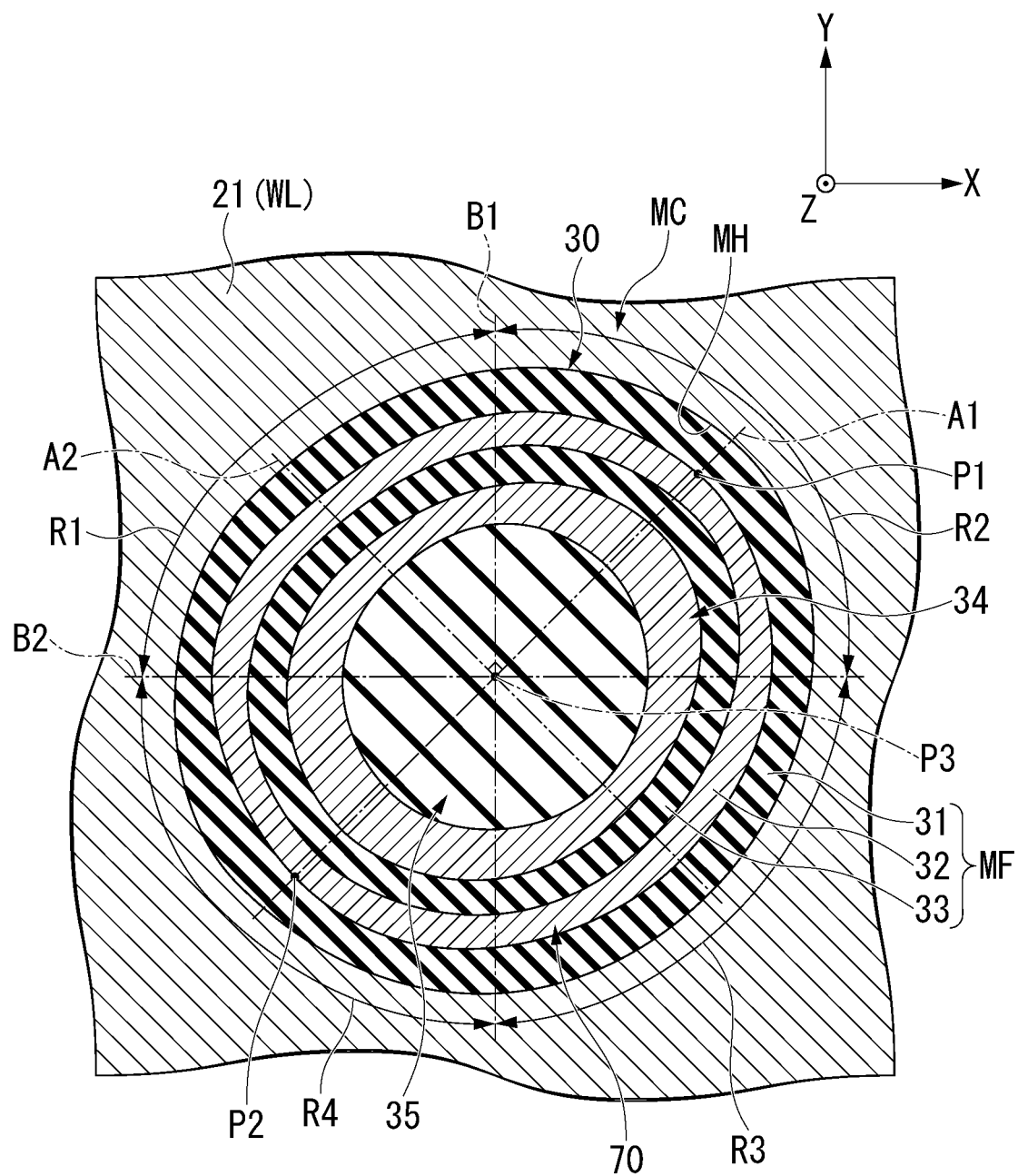
FIG. 4 is a cross-sectional view showing an example of a memory cell of the embodiment.

FIG. 4 is a cross-sectional view showing an example of the memory cell MC. As shown in FIG. 4, in an actual product, various kinds of layers included in the memory cell MC include distortion or swell instead of having a neat ring shape. Therefore, in the embodiment, the memory cell MC is divided into some regions, and "a curvature" in the case in which each region is macroscopically viewed will be defined as a curvature at each part.

Specifically, a long axis A1 and a short axis A2 are set to the memory cell MC having an oval shape. The long axis A1 is defined as a straight line passing through two points P1 and P2 which are farthest from each other on an outer circumferential edge of the memory film 32. The short axis A2 is defined as a straight line passing through a center point P3 between the two points P1 and P2 on the long axis A1 in a direction orthogonal to the long axis A1. Further, the memory cell MC is divided into four regions R1, R2, R3, and R4 by setting two boundary lines B1 and B2 tilted by 45 degrees with respect to the long axis A1.

The regions R1 and R3 are regions through which the short axis A2 passes. To be specific, the region R1 is a region including one end of the memory cell MC positioned on the short axis A2. The region R3 is a region including the other end of the memory cell MC positioned on the short axis A2. The region R3 is a region positioned on a side opposite to the region R1 with respect to the center (for example, an intersection (center point P3) between the long axis A1 and the short axis A2) of the memory cell MC.

On the other hand, the regions R2 and R4 are regions through which the long axis A1 passes. To be specific, the region R2 is a region including one end of the memory cell MC positioned on the long axis A1. The region R4 is a region including the other end of the memory cell MC positioned on the long axis A1. The region R4 is positioned on a side opposite to the region R2 with respect to the center (for example, an intersection (center point P3) between the long axis A1 and the short axis A2) of the memory cell MC. From another viewpoint, four regions R1, R2, R3, and R4 are arranged in this order in a circumferential direction of the memory cell MC with respect to the center of the memory cell MC.

In the following description, "a curvature" related to the block insulating film 31, the memory film 32, the tunnel insulating film 33, the channel layer 34, and the core insulator 35 denotes an average curvature in the above-mentioned four regions R1, R2, R3, and R4. "A curvature" may denote a curvature at an outer circumferential edge of each of the foregoing layers or may denote a curvature at an inner circumferential edge of each of the foregoing layers. Hereinafter, except for the case in which there is special description, it is considered that "a curvature" denotes a curvature at the outer circumferential edge of each of the foregoing layers.

In addition, in the following description, except for the case in which there is special description, "a film thickness" related to the block insulating film 31, the memory film 32, the tunnel insulating film 33, and the channel layer 34 denotes an average film thickness in the foregoing four regions R1, R2, R3, and R4. However, when there is special description, it may also denote "a largest film thickness" or "a smallest film thickness".

Here, as illustrated in FIG. 4, the long axis A1 and the short axis A2 may lie in a direction different from the X direction and the Y direction. However, hereinafter, for the sake of convenience of description, description will be given with reference to diagrams in which the long axis A1 lies in the X direction and the short axis A2 lies in the Y direction.

Returning to FIG. 3, description will continue. The memory film 32 includes the electric charge holder 70 in the cross section B (which will hereinafter be referred to as "an electric charge holder 70_B"). The electric charge holder 70_B has a curvature different (i.e., varying) in accordance with a position in the cross section B. For example, the electric charge holder 70_B includes a first part 70a, a second part 70b, a third part 70c, and a fourth part 70d. The first part 70a, the second part 70b, the third part 70c, and the fourth part 70d are parts included in the regions R1, R2, R3, and R4, respectively. In the embodiment, the curvature at the second part 70b is larger than each of the curvature at the first part 70a and the curvature at the third part 70c. The curvature at the fourth part 70d is larger than each of the curvature at the first part 70a and the curvature at the third part 70c.

In the embodiment, the curvature of the electric charge holder 70B (for example, the curvature at the outer circumferential edge and the curvature at the inner circumferential edge) gradually increases (consecutively increases) as it goes toward the second part 70b from the first part 70a, gradually decreases (consecutively decreases) as it goes toward the third part 70c from the second part 70b, gradually increases (consecutively increases) as it goes toward the fourth part 70d from the third part 70c, and gradually decreases (consecutively decreases) as it goes toward the first part 70a from the fourth part 70d. The electric charge holder 70B is an example of "a first electric charge holder".

The film thickness of the electric charge holder 70_B is uniform in the circumferential direction of the electric charge holder 70_B. That is, the film thicknesses of the first part 70a, the second part 70b, the third part 70c, and the fourth part 70d are the same as each other. In the embodiment, "uniform film thickness" or "the same film thickness" denotes that the difference between the largest film thickness and the smallest film thickness is less than 1 nm.

The channel layer 34 has a film thickness different (i.e., varying) in accordance with the curvature of the electric charge holder 70_B in the cross section B. For example, the channel layer 34 includes a first part 34a, a second part 34b, a third part 34c, and a fourth part 34d. The first part 34a, the second part 34b, the third part 34c, and the fourth part 34d are parts included in the regions R1, R2, R3, and R4 (refer to FIG. 4), respectively. The first part 34a is alongside the first part 70a of the electric charge holder 70_B with the tunnel insulating film 33 sandwiched therebetween. The second part 34b is provided alongside the second part 70b of the electric charge holder 70_B with the tunnel insulating film 33 sandwiched therebetween. The third part 34c is provided alongside the third part 70c of the electric charge holder 70_B with the tunnel insulating film 33 sandwiched therebetween. The fourth part 34d is provided alongside the fourth part 70d of the electric charge holder 70_B with the tunnel insulating film 33 sandwiched therebetween.

From another viewpoint, the first part 34a is positioned at one end of the channel layer 34 on the short axis A2. The first part 34a is an example of "a first thin film portion". The third part 34c is positioned at the other end of the channel layer 34 on the short axis A2. The third part 34c is an example of "a second thin film portion". The second part 34b is positioned at one end of the channel layer 34 on the long axis A1. The second part 34b is an example of "a first thick film portion". The fourth part 34d is positioned at the other end of the channel layer 34 on the long axis A1. The fourth part 34d is an example of "a second thick film portion".

In the embodiment, the film thickness (for example, average film thickness) of the second part 34b is larger than the film thickness (for example, the average film thickness) of the first part 34a and is larger than the film thickness (for example, the average film thickness) of the third part 34c. From another viewpoint, the largest film thickness of the second part 34b is larger than the largest film thickness of the first part 34a and is larger than the largest film thickness of the third part 34c. In addition, from another viewpoint, the smallest film thickness of the second part 34b is larger than the smallest film thickness of the first part 34a and is larger than the smallest film thickness of the third part 34c. For example, the largest film thickness of the second part 34b is larger than each of the smallest film thickness of the first part 34a and the smallest film thickness of the third part 34c by 1 nm or more (for example, 2 nm or more).

Similarly, the film thickness (for example, the average film thickness) of the fourth part 34d is larger than the film thickness (for example, the average film thickness) of the first part 34a and is larger than the film thickness (for example, the average film thickness) of the third part 34c. From another viewpoint, the largest film thickness of the fourth part 34d is larger than the largest film thickness of the first part 34a and is larger than the largest film thickness of the third part 34c. In addition, from another viewpoint, the smallest film thickness of the fourth part 34d is larger than the smallest film thickness of the first part 34a and is larger than the smallest film thickness of the third part 34c. For example, the largest film thickness of the fourth part 34d is larger than each of the smallest film thickness of the first part 34a and the smallest film thickness of the third part 34c by 1 nm or more (for example, 2 nm or more).

In the embodiment, the film thickness of the channel layer 34 gradually increases (consecutively increases) as it goes toward the second part 34b from the first part 34a, gradually decreases (consecutively decreases) as it goes toward the third part 34c from the second part 34b, gradually increases (consecutively increases) as it goes toward the fourth part 34d from the third part 34c, and gradually decreases (consecutively decreases) as it goes toward the first part 34a from the fourth part 34d.

As an example, each of the largest film thickness of the first part 34a and the largest film thickness of the third part 34c of the channel layer 34 is smaller than the sum of the largest film thickness of the block insulating film 31 and the largest film thickness of the memory film 32 in the cross section B. On the other hand, each of the largest film thickness of the second part 34b and the largest film thickness of the fourth part 34d of the channel layer 34 is larger than the sum of the largest film thickness of the block insulating film 31 and the largest film thickness of the memory film 32 in the cross section B.

As an example, each of the largest film thickness of the first part 34a and the largest film thickness of the third part 34c of the channel layer 34 is smaller than the sum of the largest film thickness of the memory film 32 and the largest film thickness of the tunnel insulating film 33 in the cross section B. On the other hand, each of the largest film thickness of the second part 34b and the largest film thickness of the fourth part 34d of the channel layer 34 is larger than the sum of the largest film thickness of the memory film 32 and the largest film thickness of the tunnel insulating film 33 in the cross section B.

From another viewpoint, the electric charge holder 70_B has a uniform film thickness in the circumferential direction of the electric charge holder 70_B. On the other hand, the channel layer 34 has a film thickness varying at a rate of change higher than a rate of change in the film thickness of the electric charge holder 70_B in the circumferential direction of the channel layer 34.

In addition, from another viewpoint, the channel layer 34 has an inner circumferential edge e1 and an outer circumferential edge e2 in the cross section B. The inner circumferential edge e1 is a circumferential edge adjacent to the core insulator 35. The outer circumferential edge e2 is a circumferential edge positioned on a side opposite to the inner circumferential edge e1 and adjacent to the tunnel insulating film 33. Further, the inner circumferential edge e1 has a higher roundness than the outer circumferential edge e2.

The core insulator 35 includes a first part 35a, a second part 35b, a third part 35c, and a fourth part 35d in the cross section B. The first part 35a, the second part 35b, the third part 35c, and the fourth part 35d are parts included in the regions R1, R2, R3, and R4 (refer to FIG. 4), respectively. The first part 35a is provided alongside the first part 70a of the electric charge holder 70_B with the channel layer 34 and the tunnel insulating film 33 sandwiched therebetween. The second part 35b is provided alongside the second part 70b of the electric charge holder 70_B with the channel layer 34 and the tunnel insulating film 33 sandwiched therebetween. The third part 35c is provided alongside the third part 70c of the electric charge holder 70B with the channel layer 34 and the tunnel insulating film 33 sandwiched therebetween. The fourth part 35d is provided alongside the fourth part 70d of the electric charge holder 70_B with the channel layer 34 and the tunnel insulating film 33 sandwiched therebetween. A difference between the curvatures at the first part 35a and the second part 35b of the core insulator 35 is smaller than a difference between the curvatures at the first part 70a and the second part 70b of the electric charge holder 70_B.

Figure 5:
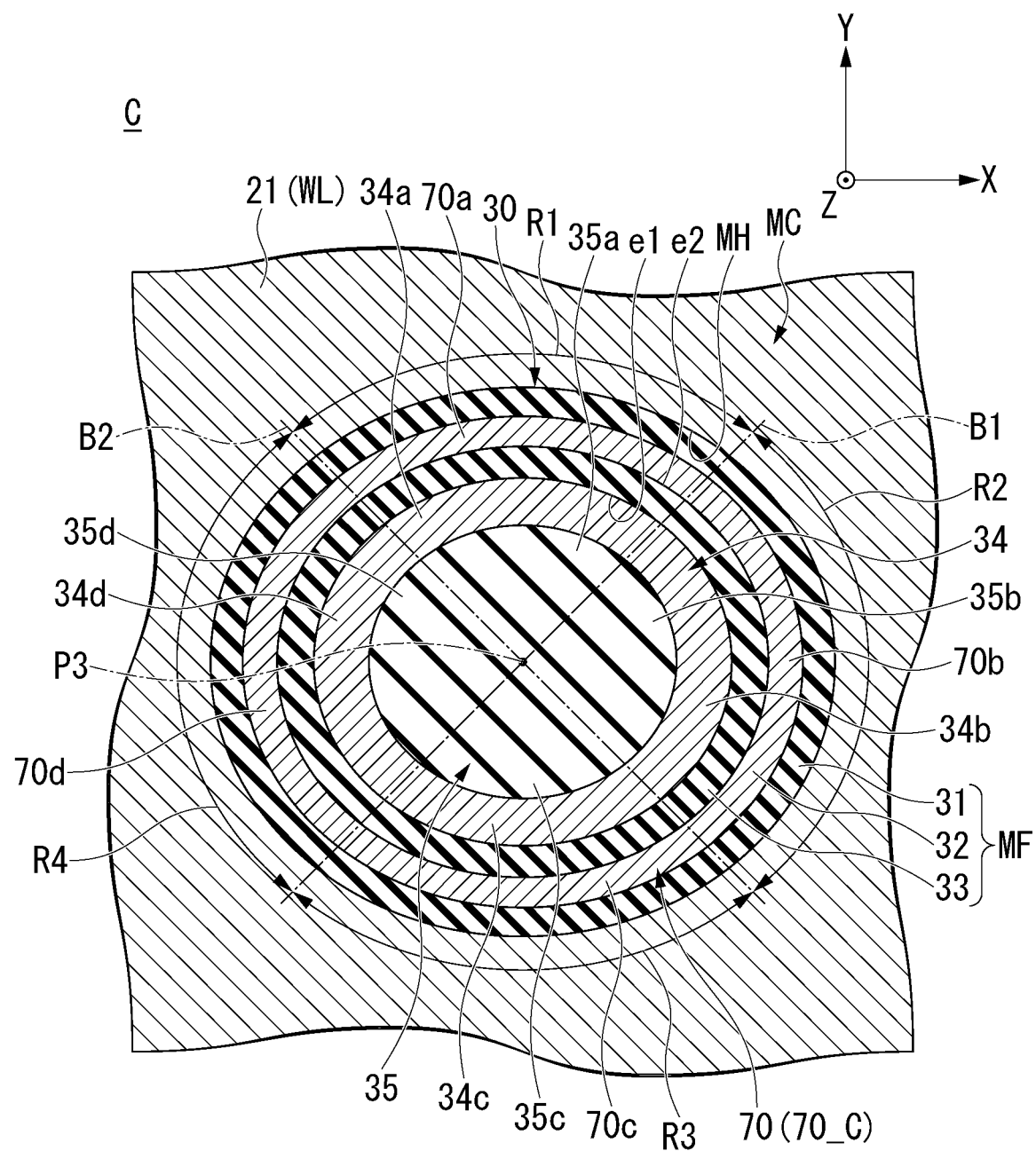
FIG. 5 is a cross-sectional view of the semiconductor storage device along line F5-F5 shown in FIG. 1.

FIG. 5 is a cross-sectional view of the semiconductor storage device 1 along line F5-F5 shown in FIG. 1. Hereinafter, a cross section along line F5-F5 in FIG. 1 will be referred to as "a cross section C". The cross section C is a cross section along the surface 10a of the silicon substrate 10 and is a cross section farther away from the silicon substrate 10 than the cross section B is. The cross section C is an example of "a second cross section".

Each of the block insulating film 31, the memory film 32, and the tunnel insulating film 33 has an oval ring shape gentler than that in the cross section B and includes a curved part in the cross section C. Each of the block insulating film 31, the memory film 32, and the tunnel insulating film 33 includes a part having a small curvature and a part having a large curvature.

The memory film 32 includes the electric charge holder 70 in the cross section C (which will hereinafter be referred to as "an electric charge holder 70_C"). The electric charge holder 70C has a curvature different (i.e., varying) in accordance with a position in the cross section C. For example, the electric charge holder 70_C includes the first part 70a, the second part 70b, the third part 70c, and the fourth part 70d. Also in the electric charge holder 70_C, the curvature at the second part 70b is larger than each of the curvature at the first part 70a and the curvature at the third part 70c. The curvature at the fourth part 70d is larger than each of the curvature at the first part 70a and the curvature at the third part 70c. The electric charge holder 70_C is an example of "a second electric charge holder".

On the other hand, the channel layer 34 includes the first part 34a, the second part 34b, the third part 34c, and the fourth part 34d in the cross section C. The first part 34a is provided alongside the first part 70a of the electric charge holder 70_C with the tunnel insulating film 33 sandwiched therebetween. The second part 34b is provided alongside the second part 70b of the electric charge holder 70C with the tunnel insulating film 33 sandwiched therebetween. The third part 34c is provided alongside the third part 70c of the electric charge holder 70_C with the tunnel insulating film 33 sandwiched therebetween. The fourth part 34d is provided alongside the fourth part 70d of the electric charge holder 70_C with the tunnel insulating film 33 sandwiched therebetween. From a certain viewpoint, the first part 70a of the electric charge holder 70_C is an example of "a third part", and the second part 70b of the electric charge holder 70_C is an example of "a fourth part".

In the embodiment, the difference between the film thicknesses of the first part 34a and the second part 34b of the channel layer 34 in the cross section B (for example, the difference between the smallest film thickness of the first part 34a and the largest film thickness of the second part 34b) is larger than the difference between the film thicknesses of the first part 34a and the second part 34b of the channel layer 34 in the cross section C (for example, the difference between the smallest film thickness of the first part 34a and the largest film thickness of the second part 34b). In the embodiment, the difference between the film thicknesses of the first part 34a and the second part 34b of the channel layer 34 increases toward the silicon substrate 10.

2. Method of Manufacturing Semiconductor Storage Device

Figure 6:
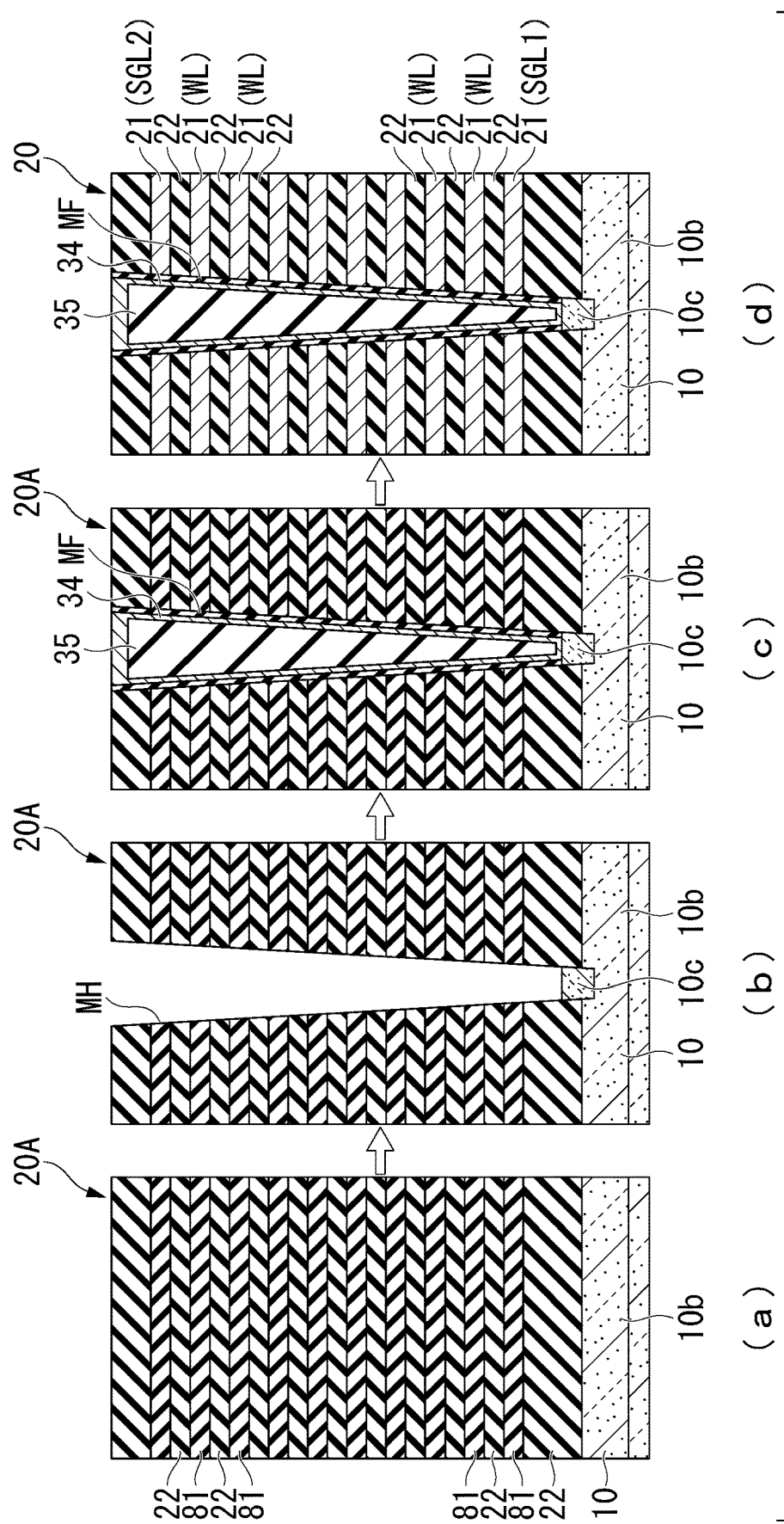
FIG. 6 is a cross-sectional view showing a method of manufacturing the semiconductor storage device of the embodiment.

FIG. 6 is a cross-sectional view showing a method of manufacturing the semiconductor storage device 1, and the view shows the entire flow. First, as shown in (a) in FIG. 6, the insulating layers 22 made of silicon oxide ($SiO_2$) and insulating layers 81 made of silicon nitride (SiN) are alternately laminated on the silicon substrate 10. Accordingly, an intermediate laminate 20A is formed. The insulating layers 81 made of silicon nitride (SiN) are sacrificing layers to be replaced with the conductive layers 21 in a succeeding step.

Next, as shown in (b) in FIG. 6, the memory holes MH are provided with respect to the intermediate laminate 20A. The memory hole MH is a hole extending in the Z direction. Next, the connectors 10c are formed by causing amorphous silicon (a-Si) (single crystal substance) to grow at the bottom of the memory holes MH.

Next, as shown in (c) in FIG. 6, a material for the block insulating film 31, a material for the memory film 32, a material for the tunnel insulating film 33, and a material for the channel layer 34 are supplied to the inner circumferential surface of the memory holes MH in order, and the block insulating film 31, the memory film 32, the tunnel insulating film 33, and the channel layer 34 are formed. Next, silicon oxide ($SiO_2$) is supplied to the inner side of the channel layer 34, and the core insulator 35 is formed.

Next, as shown in (d) in FIG. 6, the replacement step of replacing the insulating layers 81 in the intermediate laminate 20A with the conductive layers 21 is performed. To be specific, silicon nitride (SiN) forming the insulating layers 81 is removed through holes (not illustrated) provided in the intermediate laminate 20A. Next, a conductive material (tungsten (W)) is supplied to the spaces where the insulating layers 81 are removed, and the word lines WL, the first selection gate lines SGL1, and the second selection gate lines SGL2 are formed. Accordingly, the laminate 20 is formed. Thereafter, the contacts 40, the bit lines BL, and the like are formed, and the semiconductor storage device 1 is completed.

Figure 7:
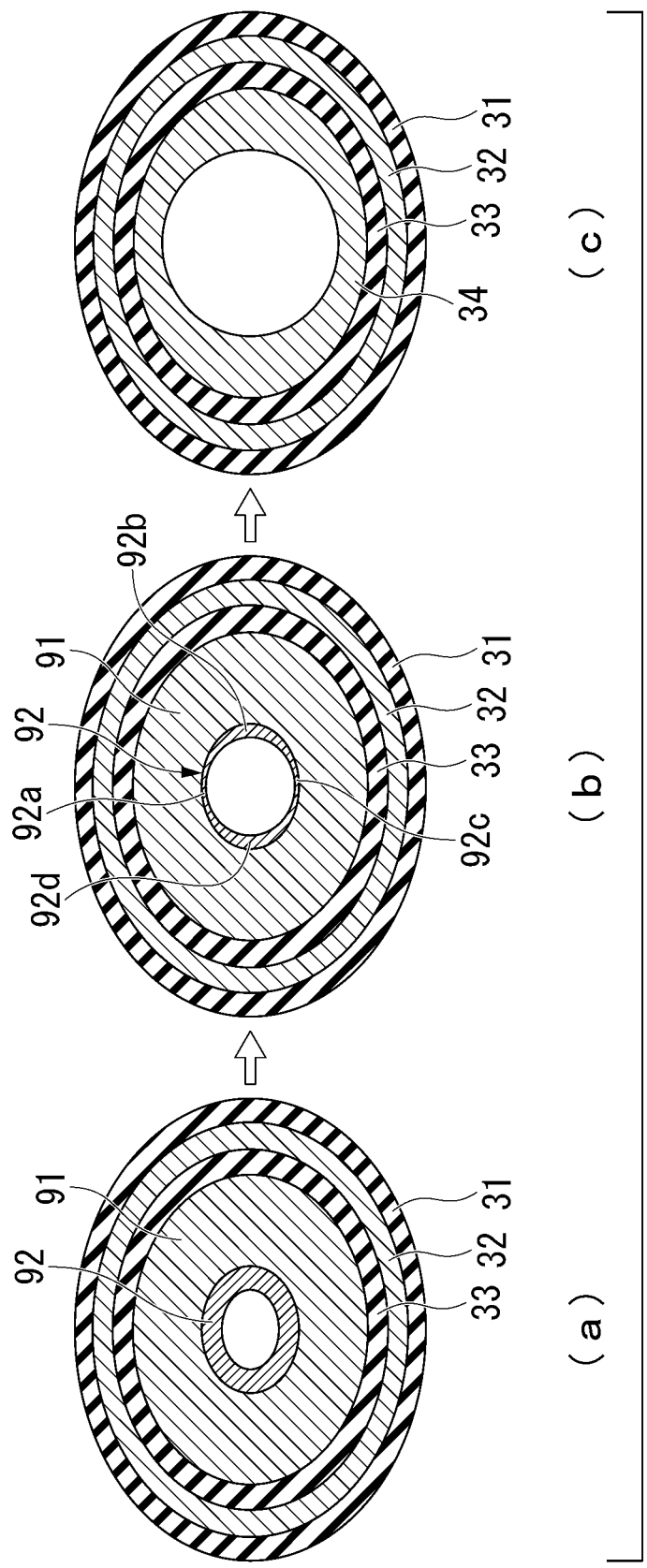
FIG. 7 is a cross-sectional view showing the method of manufacturing the semiconductor storage device of the embodiment.

FIG. 7 is a cross-sectional view showing the method of manufacturing the semiconductor storage device 1 and shows details of the step described with reference to (c) in FIG. 6 (i.e., a step of forming the memory pillar 30). FIG. 7 is a cross-sectional view showing the cross section B, and illustration of the configuration around the memory cell MC is omitted.

As shown in (a) in FIG. 7, when amorphous silicon (a-Si) (semiconductor material) is supplied to the inner circumferential surface of the tunnel insulating film 33 as a material for the channel layer 34 and heat treatment for crystallizing the amorphous silicon is performed, a channel layer intermediate body 91 which is a base of the channel layer 34 is formed. In this stage, the channel layer intermediate body 91 is formed to have a larger film thickness than the channel layer 34. For example, a thermal oxide film 92 (silicon oxide (SiO$_2$)) is formed on the inner circumferential side of the channel layer intermediate body 91.

Next, as shown in (b) in FIG. 7, the thermal oxide film 92 is removed through wet etching using a first solution (first liquid chemical) while a portion of the thermal oxide film 92 is left behind. The first solution is a solution in which the thermal oxide film 92 is more likely to dissolve than in a second solution (which will be described below) and is a solution in which an etching rate of the thermal oxide film 92 is equal to or faster than a predetermined rate. For example, the first solution is dilute hydrofluoric acid (DHF). In the embodiment, a period of time for wet etching using the first solution, a concentration of the first solution, and the like are adjusted such that a portion of the thermal oxide film 92 is left behind on the inner side of the channel layer intermediate body 91 after the step of wet etching using the first solution.

Here, when the thermal oxide film 92 having an oval ring shape is removed through wet etching, etching of both ends 92b and 92d in a long axis direction is less likely to proceed than that at both ends 92a and 92c in a short axis direction in the thermal oxide film 92 due to stress dependence or other reasons. For this reason, when the thermal oxide film 92 is removed such that a portion of the thermal oxide film 92 remains, the thermal oxide film 92 remains on the inner side of the channel layer intermediate body 91 in a state in which the ends 92b and 92d have a large film thickness and the ends 92a and 92c have a small film thickness. In the present step, the ends 92b and 92d of the thermal oxide film 92 need only remain on the inner side of the channel layer intermediate body 91, and the ends 92a and 92c of the thermal oxide film 92 may be removed.

Next, as shown in (c) in FIG. 7, the channel layer 34 is formed by slimming the channel layer intermediate body 91 through wet etching using the second solution (second liquid chemical) different from the first solution in a state in which a portion of the thermal oxide film 92 is left behind on the inner side of the channel layer intermediate body 91. The second solution is a solution in which the channel layer intermediate body 91 is more likely to dissolve than in the first solution. That is, the second solution is a solution having a higher etching rate with respect to the channel layer intermediate body 91 than the first solution. On the other hand, the second solution is a solution in which the thermal oxide film 92 is less likely to dissolve than in the first solution. That is, the second solution is a solution having a lower etching rate with respect to the thermal oxide film 92 than the first solution. For example, the second solution is a liquid mixture of a hydrogen peroxide solution, choline, and water.

As wet etching using the second solution proceeds, first, the ends 92a and 92c of the thermal oxide film 92 are removed, and slimming of parts positioned on the short axis in the channel layer intermediate body 91 starts. Thereafter, after the ends 92b and 92d of the thermal oxide film 92 are removed with a time difference, slimming of parts positioned on the long axis in the channel layer intermediate body 91 starts. Accordingly, the channel layer 34 having a film thickness varying in accordance with a position in the circumferential direction is obtained. Thereafter, the core insulator 35 is provided on the inner side of the channel layer 34, and the step of (c) in FIG. 6 ends.

3. Advantage

In the semiconductor storage device, it is difficult to process all the memory pillars into a complete circle from the upper layer to the lower layer. For this reason, for example, the memory cell has an oval cross-sectional shape in a region of the lower layer. In this case, electrical characteristics (for example, write characteristics) may deteriorate.

Figure 8:
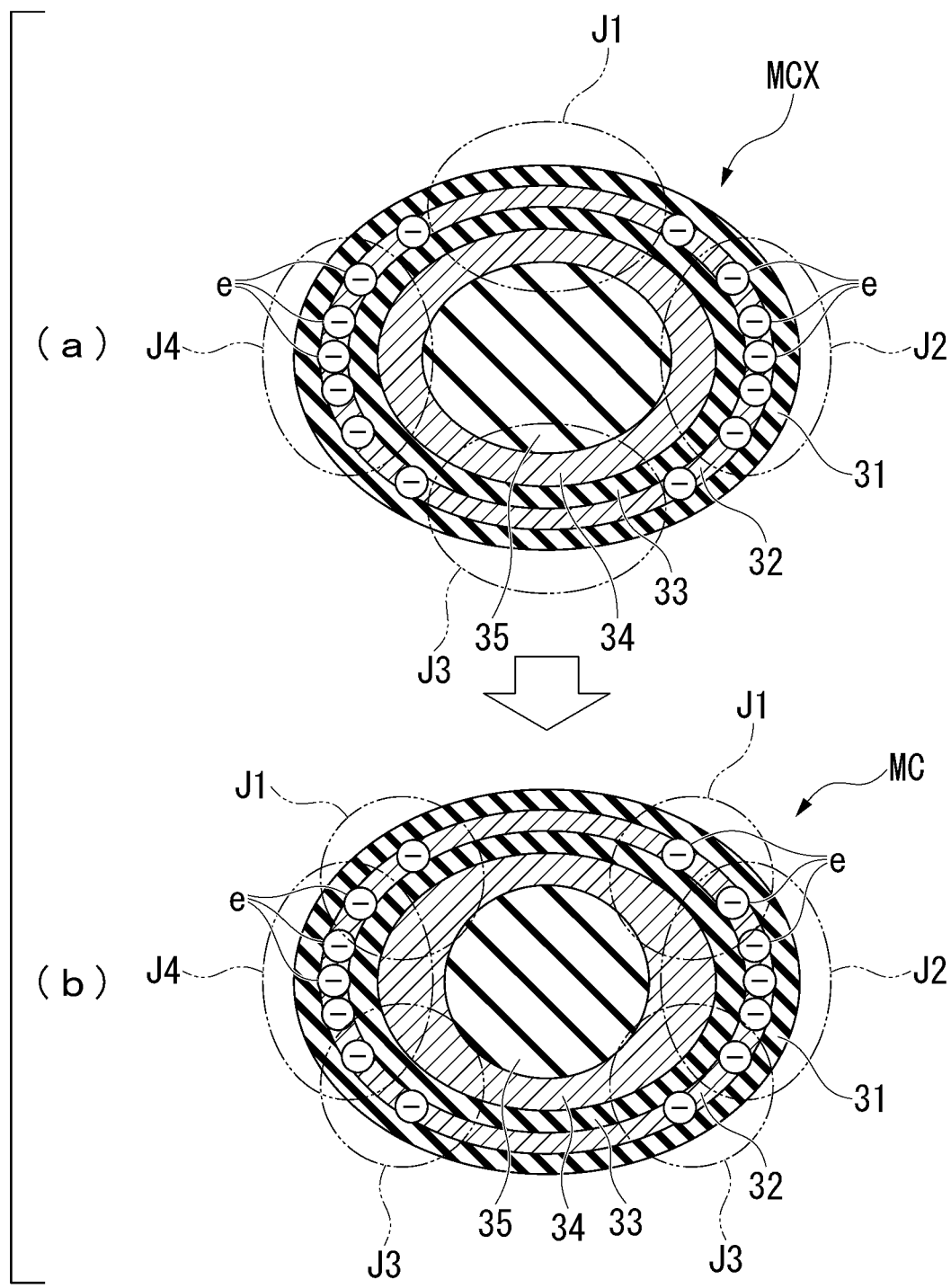
FIG. 8 is a cross-sectional view showing an operation of the semiconductor storage device of the embodiment.

FIG. 8 is a cross-sectional view for describing operation of the semiconductor storage device 1. As a comparative example, (a) in FIG. 8 shows a memory cell MCX in which each of the block insulating film 31, the memory film 32, the tunnel insulating film 33, and the channel layer 34 has an oval ring shape and the channel layer 34 has a uniform film thickness. In such a memory cell MCX, when a voltage is applied to the word line WL at the time of write operation of data, an electric field is likely to be generated in regions J2 and J4 having a large curvature in the memory cell MCX, and electric charges e are likely to be concentrated and stored in the regions J2 and J4 having the large curvature in the memory cell MC.

On the other hand, when a read current flows in the channel layer 34 at the time of read operation of data, a read current tends to flow through regions J1 and J3 having a small amount of the electric charges e in the channel layer 34. That is, in the memory cell MC, the regions J2 and J4 functioning at the time of write operation and the regions J1 and J3 functioning at the time of read operation are different. In this case, even if sufficient electric charges e are stored in the regions J2 and J4 of the memory cell MC, it is determined such that sufficient electric charges e are not stored. As a result, there is a need to store more electric charges e in the memory cell MC at the time of write operation, and thus a write speed may be slowed down. For this reason, a difference between the write speeds of the memory cell MC having favorable roundness and the memory cell MC having poor roundness increases, and write characteristics deteriorate.

Hence, the semiconductor storage device 1 of the present embodiment includes the channel layer 34 having a film thickness different in accordance with the curvature of the electric charge holder 70. According to such a configuration, as shown in (b) in FIG. 8, a read current is likely to flow in a part of the channel layer 34 having a large film thickness (i.e., near a region in which a large amount of electric charges e are stored) due to a relationship of a current density. That is, in the memory cell MC, the regions J1 and J3 functioning at the time of read operation is closer to the regions J2 and J4 functioning at the time of write operation. As a result, compared to the configuration of the comparative example, it is less necessary to store a large amount of electric charges e in the memory cell MC, and thus the write speed can be improved. Accordingly, the difference between the write speeds of the memory cell MC having favorable roundness and the memory cell MC having poor roundness decreases, and write characteristics become favorable.

Modification Example

Figure 9:
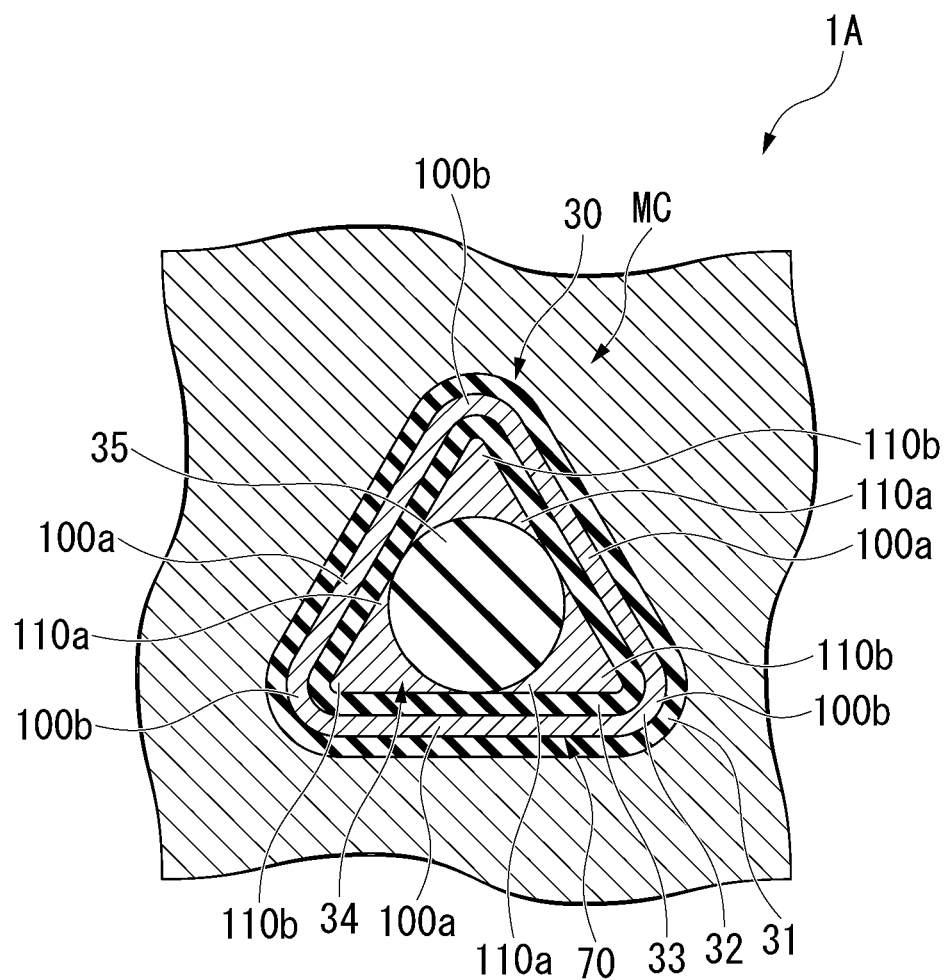
FIG. 9 is a cross-sectional view showing a semiconductor storage device of a modification example of the embodiment.

FIG. 9 is a cross-sectional view showing a semiconductor storage device 1A of a modification example of the embodiment. FIG. 9 shows the cross section B of the semiconductor storage device 1A. In the modification example, the memory cell MC has a triangular shape. Each of the block insulating film 31, the memory film 32, and the tunnel insulating film 33 is formed in a triangular ring shape along the inner circumferential surface of the memory hole MH having a triangular shape. The electric charge holder 70 includes first parts 100a and second parts 100b having a larger curvature than the first parts 100a. The first parts 100a are parts corresponding to central portions of sides of the triangle. On the other hand, the second parts 100b are parts corresponding to corners of the triangle.

In the modification example, the channel layer 34 includes thin film portions 110a and thick film portions 110b having a larger film thickness than the thin film portions 110a. The thin film portions 110a are provided in regions corresponding to the central portions of the sides of the triangle and are provided alongside the first parts 100a of the electric charge holder 70 with the tunnel insulating film 33 sandwiched therebetween. On the other hand, the thick film portions 110b are provided in regions corresponding to the corners of the triangle and are provided alongside the second parts 100b of the electric charge holder 70 with the tunnel insulating film 33 sandwiched therebetween. Even in such a configuration, similar to the embodiment, electrical characteristics can be improved.

Hereinabove, the semiconductor storage device and the method of manufacturing a semiconductor storage device of the embodiment have been described. However, the embodiment is not limited to the foregoing examples. In the embodiment described above, an example in which the electric charge holder 70 is formed using the memory film 32 (charge trapping film) has been described. However, the electric charge holder 70 of the memory cell MC may be a floating gate capable of storing data based on the storage amount of electric charges, or a ferroelectric film (FeFET) capable of storing data based on an oriented direction of polarization. The electric charge holder 70 may be disposed between two insulating layers 22 adjacent to each other in the Z direction in the laminate 20, instead of being provided as a part of the memory pillar 30.

According to at least one embodiment described above, the semiconductor storage device includes a channel layer having a film thickness different in accordance with the curvature of an electric charge holder. According to such a configuration, it is possible to provide a semiconductor storage device and method of manufacturing a semiconductor storage device in which electrical characteristics may be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a substrate;
   a first electric charge holder, at least a part of the first electric charge holder being curved in a first cross section along a surface of the substrate;
   a channel layer inside the first electric charge holder in the first cross section, at least a part of the channel layer being curved in the first cross section; and
   a first conductor provided outside an entire circumference of the first electric charge holder in the first cross section,
   wherein
   the first electric charge holder has a curvature varying in accordance with a position in the first cross section,
   the channel layer has a film thickness varying in accordance with the curvature of the first electric charge holder in the first cross section,
   the first electric charge holder includes, in the first cross section, a first part and a second part, the second part having a larger curvature than the first part,
   the channel layer includes, in the first cross section, a first part and a second part, the first part of the channel layer being alongside the first part of the first electric charge holder, the second part of the channel layer being alongside the second part of the first electric charge holder, and
   the second part of the channel layer has a larger film thickness than the first part of the channel layer, and
   a difference between film thicknesses at the first part and the second part of the channel layer is larger than a difference between film thicknesses at the first part and the second part of the first electric charge holder.

2. The semiconductor storage device according to claim 1, wherein
   the first part of the channel layer is alongside the first part of the first electric charge holder with a first insulating film sandwiched therebetween, and
   the second part of the channel layer is alongside the second part of the first electric charge holder with the first insulating film sandwiched therebetween.

3. The semiconductor storage device according to claim 1, wherein
   a largest film thickness of the second part of the channel layer is larger than a smallest film thickness of the first part of the channel layer by 1 nm or more.

4. The semiconductor storage device according to claim 1 further comprising:
   an insulator inside the channel layer, wherein
   the insulator includes, in the first cross section, a first part and a second part, the first part of the insulator being alongside the first part of the first electric charge holder with the channel layer sandwiched therebetween, the second part of the insulator being alongside the second part of the first electric charge holder with the channel layer sandwiched therebetween, and
   a difference between curvatures at the first part and the second part of the insulator is smaller than the difference between curvatures at the first part and the second part of the first electric charge holder.

5. The semiconductor storage device according to claim 4, wherein
   the first part of the insulator is alongside the first part of the first electric charge holder with the channel layer and a first insulating film sandwiched therebetween, and
   the second part of the insulator is alongside the second part of the first electric charge holder with the channel layer and the first insulating film sandwiched therebetween.

6. The semiconductor storage device according to claim 1, wherein
   the channel layer has a ring shape, and the channel layer has an outer circumferential edge and an inner circumferential edge in the first cross section, and the inner circumferential edge has a higher roundness than the outer circumferential edge.

7. The semiconductor storage device according to claim 1, wherein
the channel layer has an oval ring shape in the first cross section, and the channel layer includes a first thick film portion at one end of the channel layer on a long axis of the oval ring shape, a second thick film portion at the other end of the channel layer on the long axis, a first thin film portion at the one end of the channel layer on a short axis of the oval ring shape orthogonal to the long axis, and a second thin film portion at the other end of the channel layer on the short axis,
the first thick film portion has a film thickness larger than each of the first thin film portion and the second thin film portion, and
the second thick film portion has a film thickness larger than each of the first thin film portion and the second thin film portion.

8. The semiconductor storage device according to claim 7, wherein
the film thickness of the channel layer gradually increases as a position in the channel layer gets closer to the first thick film portion from the first thin film portion, gradually decreases as the position gets closer to the second thin film portion from the first thick film portion, gradually increases as the position gets closer to the second thick film portion from the second thin film portion, and gradually decreases as the position gets closer to the first thin film portion from the second thick film portion.

9. A semiconductor storage device comprising:
a substrate;
a first electric charge holder, at least a part of the first electric charge holder being curved in a first cross section along a surface of the substrate;
a channel layer inside the first electric charge holder in the first cross section, at least a part of the channel layer being curved in the first cross section; and
a first conductor provided outside the entire circumference of the first electric charge holder in the first cross section,
wherein
the first electric charge holder has a curvature varying in accordance with a position in the first cross section,
the channel layer has a film thickness varying in accordance with the curvature of the first electric charge holder in the first cross section, and
the film thickness of the channel layer varies at a rate of change higher than a rate of change in film thickness of the first electric charge holder in the first cross section.

10. The semiconductor storage device according to claim 9 further comprising:
an insulator inside the channel layer, wherein
the first electric charge holder includes, in the first cross section, a first part and a second part, the second part having a larger curvature than the first part,
the insulator includes, in the first cross section, a first part and a second part, the first part of the insulator being alongside the first part of the first electric charge holder with the channel layer sandwiched therebetween, the second part of the insulator being alongside the second part of the first electric charge holder with the channel layer sandwiched therebetween, and
a difference between curvatures at the first part and the second part of the insulator is smaller than the difference between curvatures at the first part and the second part of the first electric charge holder.

11. The semiconductor storage device according to claim 10, wherein
the first part of the insulator is alongside the first part of the first electric charge holder with the channel layer and a first insulating film sandwiched therebetween, and
the second part of the insulator is alongside the second part of the first electric charge holder with the channel layer and the first insulating film sandwiched therebetween.

12. The semiconductor storage device according to claim 9, wherein
the channel layer has a ring shape, and the channel layer has an outer circumferential edge and an inner circumferential edge in the first cross section, and
the inner circumferential edge has a higher roundness than the outer circumferential edge.

13. The semiconductor storage device according to claim 9, wherein
the channel layer has an oval ring shape in the first cross section, and the channel layer includes a first thick film portion at one end of the channel layer on a long axis of the oval ring shape, a second thick film portion at the other end of the channel layer on the long axis, a first thin film portion at the one end of the channel layer on a short axis of the oval ring shape orthogonal to the long axis, and a second thin film portion at the other end of the channel layer on the short axis,
the first thick film portion has a film thickness larger than each of the first thin film portion and the second thin film portion, and
the second thick film portion has a film thickness larger than each of the first thin film portion and the second thin film portion.

14. The semiconductor storage device according to claim 13, wherein
the film thickness of the channel layer gradually increases as a position in the channel layer gets closer to the first thick film portion from the first thin film portion, gradually decreases as the position gets closer to the second thin film portion from the first thick film portion, gradually increases as the position gets closer to the second thick film portion from the second thin film portion, and gradually decreases as the position gets closer to the first thin film portion from the second thick film portion.

15. A semiconductor storage device comprising:
a substrate;
a first electric charge holder, at least a part of the first electric charge holder being curved in a first cross section along a surface of the substrate;
a channel layer inside the first electric charge holder in the first cross section, at least a part of the channel layer being curved in the first cross section;
a first conductor provided outside the entire circumference of the first electric charge holder in the first cross section, and
a second electric charge holder at a position farther away from the substrate than the first electric charge holder, at least a part of the second electric charge holder being curved,
wherein
the first electric charge holder has a curvature varying in accordance with a position in the first cross section, the channel layer has a film thickness varying in accordance with the curvature of the first electric charge holder in the first cross section, and the first electric charge holder includes, in the first cross section, a first part and a second part, the second part having a larger curvature than the first part, the second electric charge holder includes, in a second cross section, a first part and a second part, the second part of the second electric charge holder having a larger curvature than the first part of the second electric charge holder, the second cross section being along the surface of the substrate and farther away from the substrate than the first cross section, the channel layer includes, in the first cross section, a first part and a second part, the first part of the channel layer being alongside the first part of the first electric charge holder, the second part of the channel layer being alongside the second part of the first electric charge holder, and the channel layer includes, in the second cross section, a third part and a fourth part, the third part of the channel layer being alongside the first part of the second electric charge holder, the fourth part of the channel layer being alongside the second part of the second electric charge holder, and a difference between film thicknesses at the first part and the second part of the channel layer is larger than a difference between film thicknesses at the third part and the fourth part of the channel layer.

16. The semiconductor storage device according to claim 15 further comprising:

an insulator inside the channel layer, wherein the first electric charge holder includes, in the first cross section, a first part and a second part, the second part having a larger curvature than the first part, the insulator includes, in the first cross section, a first part and a second part, the first part of the insulator being alongside the first part of the first electric charge holder with the channel layer sandwiched therebetween, the second part of the insulator being alongside the second part of the first electric charge holder with the channel layer sandwiched therebetween, and a difference between curvatures at the first part and the second part of the insulator is smaller than the difference between curvatures at the first part and the second part of the first electric charge holder.

17. The semiconductor storage device according to claim 16, wherein the first part of the insulator is alongside the first part of the first electric charge holder with the channel layer and a first insulating film sandwiched therebetween, and the second part of the insulator is alongside the second part of the first electric charge holder with the channel layer and the first insulating film sandwiched therebetween.

18. The semiconductor storage device according to claim 15, wherein the channel layer has a ring shape, and the channel layer has an outer circumferential edge and an inner circumferential edge in the first cross section, and the inner circumferential edge has a higher roundness than the outer circumferential edge.

19. The semiconductor storage device according to claim 15, wherein the channel layer has an oval ring shape in the first cross section, and the channel layer includes a first thick film portion at one end of the channel layer on a long axis of the oval ring shape, a second thick film portion at the other end of the channel layer on the long axis, a first thin film portion at the one end of the channel layer on a short axis of the oval ring shape orthogonal to the long axis, and a second thin film portion at the other end of the channel layer on the short axis, the first thick film portion has a film thickness larger than each of the first thin film portion and the second thin film portion, and the second thick film portion has a film thickness larger than each of the first thin film portion and the second thin film portion.

20. The semiconductor storage device according to claim 19, wherein the film thickness of the channel layer gradually increases as a position in the channel layer gets closer to the first thick film portion from the first thin film portion, gradually decreases as the position gets closer to the second thin film portion from the first thick film portion, gradually increases as the position gets closer to the second thick film portion from the second thin film portion, and gradually decreases as the position gets closer to the first thin film portion from the second thick film portion.

* * * * *